(12) United States Patent
Frosien et al.

(10) Patent No.: US 8,049,180 B2
(45) Date of Patent: Nov. 1, 2011

(54) ACHROMATIC MASS SEPARATOR

(75) Inventors: Juergen Frosien, Riemerling (DE); Helmut Banzhof, Poing (DE)

(73) Assignee: ICT, Integrated Circuit Testing Gesellschaft fur Halbleiterpruftechnik MBH, Heimstetten (DE)

( * ) Notice: Subject to any disclaimer, the term of this patent is extended or adjusted under 35 U.S.C. 154(b) by 298 days.

(21) Appl. No.: 11/925,598

(22) Filed: Oct. 26, 2007

(65) Prior Publication Data

US 2008/0185514 A1     Aug. 7, 2008

(30) Foreign Application Priority Data

Feb. 6, 2007   (EP) ..................................... 07002552

(51) Int. Cl.
    *B01D 59/44*     (2006.01)
(52) U.S. Cl. ................... 250/396 R; 250/306; 250/309; 250/492.2; 250/492.21; 250/492.3
(58) Field of Classification Search .................. 250/306, 250/309, 396 R, 492.1, 492.2, 492.21, 492.23, 250/492.3, 515.1
See application file for complete search history.

(56) References Cited

U.S. PATENT DOCUMENTS

| | | | | |
|---|---|---|---|---|
| 3,649,827 A | * | 3/1972 | Bell et al. | 250/298 |
| 4,362,945 A | * | 12/1982 | Riecke | 250/396 R |
| 4,590,379 A | * | 5/1986 | Martin | 250/396 R |
| 4,649,316 A | * | 3/1987 | Cleaver et al. | 313/361.1 |
| 4,687,940 A | * | 8/1987 | Ward et al. | 250/492.2 |
| 4,697,086 A | * | 9/1987 | Ishitani et al. | 250/492.2 |
| 4,710,639 A | * | 12/1987 | Sawaragi | 250/492.2 |
| 4,755,685 A | * | 7/1988 | Kawanami et al. | 250/492.2 |
| 4,851,693 A | * | 7/1989 | Fisher | 250/492.3 |
| 4,894,549 A | * | 1/1990 | Stengl | 250/492.2 |
| 5,063,294 A | * | 11/1991 | Kawata et al. | 850/63 |
| 5,151,605 A | * | 9/1992 | Politiek et al. | 250/492.2 |
| 5,165,954 A | * | 11/1992 | Parker et al. | 430/5 |
| 5,206,516 A | * | 4/1993 | Keller et al. | 250/492.2 |

(Continued)

FOREIGN PATENT DOCUMENTS

DE       287354 A5     2/1991

(Continued)

OTHER PUBLICATIONS

Bohlander et al., An achromatic mass filter employing permanent magnets for the Delft ion beam pattern generator, Microelectronic Engineering 7 (1987) pp. 61-89.*

(Continued)

*Primary Examiner* — Robert Kim
*Assistant Examiner* — Michael Logie
(74) *Attorney, Agent, or Firm* — Patterson & Sheridan, LLP (57) ABSTRACT

An ion beam device is described. The ion beam device includes an ion beam source for generating an ion beam, the ion beam being emitted along a first axis, an aperture unit adapted to shape the ion beam, and an achromatic deflection unit adapted to deflect ions of the ion beam having a predetermined mass by a deflecting angle. The achromatic deflection unit includes: an electric field generating component for generating an electric field, and a magnetic field generating component for generating a magnetic field substantially perpendicular to the electric field. The device further includes a mass separation aperture adapted for blocking ions with a mass different from the predetermined mass and for allowing ions having the predetermined mass to trespass the mass separator, and an objective lens having a second optical axis, wherein the second optical axis is inclined with regard to the first axis.

23 Claims, 8 Drawing Sheets

U.S. PATENT DOCUMENTS

| | | | |
|---|---|---|---|
| 5,350,924 A * | 9/1994 | Stengl et al. | 250/492.2 |
| 5,369,279 A * | 11/1994 | Martin | 250/396 R |
| 5,825,035 A * | 10/1998 | Mizumura et al. | 250/423 R |
| 6,175,122 B1 * | 1/2001 | Groves et al. | 250/492.23 |
| 6,410,924 B1 * | 6/2002 | Wang | 250/398 |
| 6,509,569 B1 * | 1/2003 | Frosien | 250/396 R |
| 6,559,454 B1 * | 5/2003 | Murrell et al. | 250/423 R |
| 6,670,624 B1 * | 12/2003 | Adams et al. | 250/492.21 |
| 7,112,792 B2 * | 9/2006 | Agemura et al. | 250/310 |
| 7,501,644 B2 * | 3/2009 | Zani et al. | 250/492.21 |
| 2006/0022143 A1 * | 2/2006 | Pilz et al. | 250/423 R |
| 2007/0034399 A1 * | 2/2007 | Pilz et al. | 174/68.1 |
| 2008/0160431 A1 * | 7/2008 | Scott et al. | 430/5 |

FOREIGN PATENT DOCUMENTS

| | | |
|---|---|---|
| EP | 1 235 251 | 8/2002 |
| EP | 1 622 182 | 2/2006 |
| JP | 62237651 | 10/1987 |
| JP | 06-062045 A | 3/1994 |
| JP | 10-506225 T | 6/1998 |
| JP | 2006-040900 A | 2/2006 |
| WO | WO-96/16426 A1 | 5/1996 |
| WO | WO-01/33603 A1 | 5/2001 |

OTHER PUBLICATIONS

Extended European Search Report dated Nov. 13, 2007.

J. Teichert et al., "Design of an achromatic mass separator for a focused ion beam system," SPIE Charged-Particle Optics, 1993 vol. 2014: pp. 85-95.

Notice of Reasons for Rejection dated Dec. 14, 2010 for Japanese Patent Application No. 2007-278898.

* cited by examiner

ACHROMATIC MASS SEPARATOR

FIELD OF THE INVENTION

The invention relates to an ion beam device. Particularly, it relates to an achromatic mass separator for an ion beam device and an ion beam device having an achromatic mass separator. More particularly it relates to an ion beam device having a liquid metal alloy ion source (LMAIS) and an achromatic mass separator. Specifically, it relates to an ion beam device and a method of operating an ion beam device.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams, e.g., probing or structuring is often performed with charged particle beams which are generated and focused in charged particle beam devices. Examples of charged particle beam devices are ion beam implanters, electron microscopes, electron beam pattern generators, ion microscopes as well as ion beam pattern generators. Charged particle beams offer superior spatial resolution compared to photon beams, due to their short wave lengths at comparable particle energy.

Ion beam devices can be used for a plurality of applications. Examples include the preparation of cross sections of semiconductor devices by ion milling, the production of microstructures by ion milling, the writing of structures like quantum dots, quantum wires, magnetic nano-dots etc. by ion implantation, sputtering, inspection or other applications. Thereby, different milling rates, sputtering rates or other characteristics, which may require different beam currents can be desirable. The beam current may, for example, be adjusted by the amount of collimation of a condenser lens.

However, applying different beam paths and, at the same time, providing mass separation by Wien filters, sectors, and the like is difficult to obtain. In light thereof, e.g., Teicher and Tiunov ("Design of an achromatic mass separator for a focused ion beam," SPIE Vol. 2014 Charged Particle Optics (1993)/85) propose the use of two ExB filters, whereby the pivot point of such a system can be moved along the optical axis. However, such a system is complicated to align, expensive, and difficult to calibrate for different beam paths.

SUMMARY

In light of the above, the present invention provides an ion beam device according to independent claim 1 and a method of operating an ion beam device according to independent claim 17.

According to one embodiment, an ion beam device is provided. The ion beam device includes: an ion beam source for generating an ion beam, the ion beam being emitted along a first axis, an aperture unit adapted to define the numerical aperture of the ion beam, an achromatic deflection unit adapted to deflect ions of the ion beam having a predetermined mass by a deflecting angle, the achromatic deflection unit includes: an electric field generating component for generating an electric field and a magnetic field generating component for generating a magnetic field substantially perpendicular to the electric field. The device further includes a mass separation aperture adapted for blocking ions with a mass different from the predetermined mass and for allowing ions having the predetermined mass to trespass the mass separation aperture and an objective lens having a second optical axis, wherein the second optical axis is inclined with regard to the first axis.

Further advantages, features, aspects and details that can be combined with the above embodiments are evident from the dependent claims, the description and the drawings.

According to another embodiment, a method of operating an ion beam device is provided. The method includes: emitting an ion beam, the ion beam including two ion species having a first mass and a second mass different from the first mass, deflecting the ions having the first mass by a deflection angle of at least 0.1°, or, e.g., at least 0.3°, blocking the ions having the second mass, and focusing the ion beam of the ions having the first mass on a specimen.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments are also directed to methods by which the described apparatus operates. It includes method steps for carrying out every function of the apparatus.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE INVENTION

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the ion beam device or components thereof will for some embodiments exemplarily be referred to as a ion beam device including the detection of secondary electrons. The present invention can still be applied for apparatuses and components detecting secondary and/or backscattered particles in the form of electrons or ions, photons, X-rays or other corpuscles in order to obtain a specimen image. Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited.

Within the following description, the term Lorentz force is used for the force $F_m = q \cdot (v \times B)$. The term Coulomb force is used for the force $F_e = q \cdot E$.

Figure 1A:
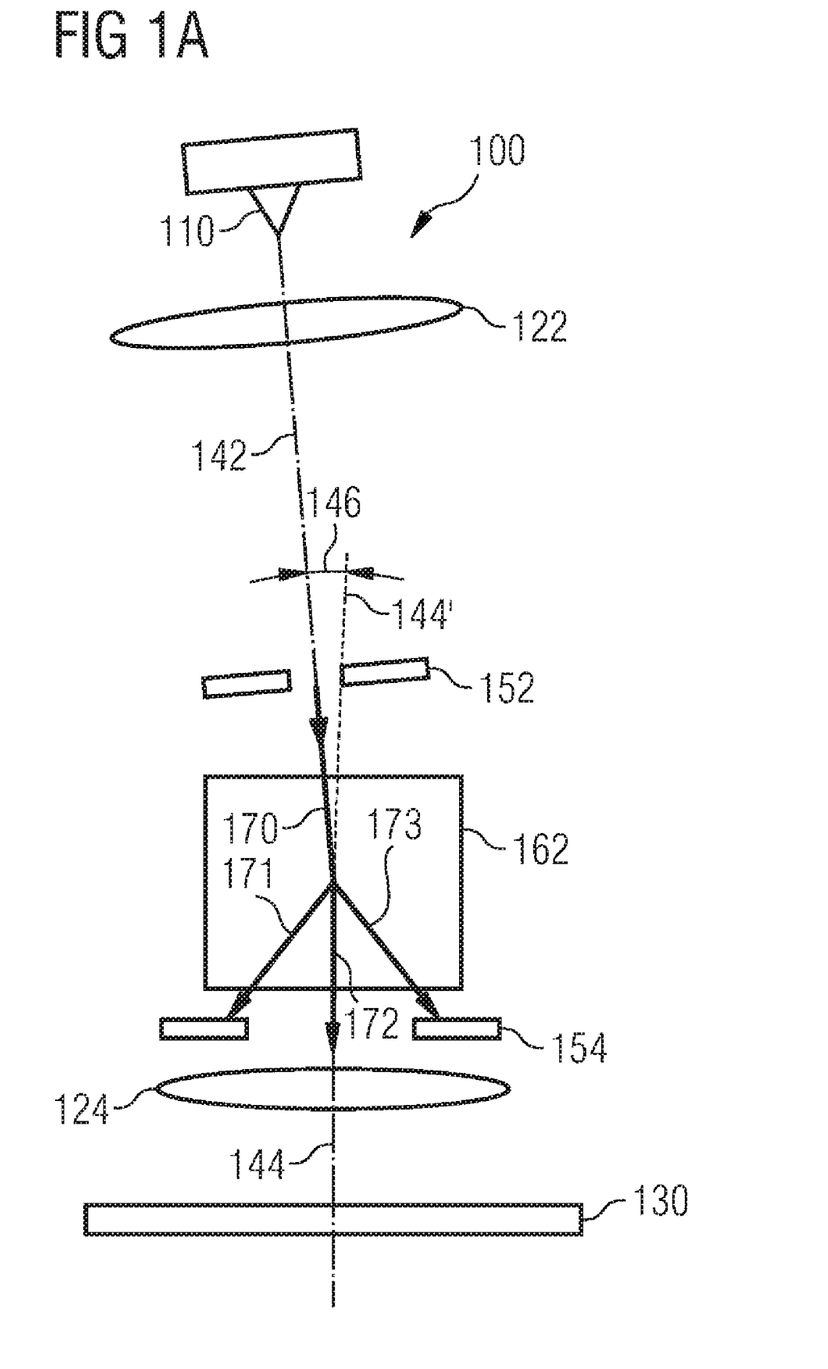
FIG. 1A shows a schematic view of an ion beam device including a mass separation for the ion beam according to embodiments described herein.

Within FIG. 1 an ion beam device 100 is shown. According to one embodiment, the ion beam device includes an ion beam source 110. The ion beam source emits an ion beam along a first axis 142. The condenser lens 122 is used to collimate the ion beam. An aperture 152 in the form of a diaphragm that might have a circular, slit-shaped, rectangular, or another desired shape is used to provide a numerical aperture of the ion beam system.

Within FIG. 1, the ion beam 170, which originates from the ion beam source 110, is shown to enter the achromatic deflection unit 162. Within the achromatic deflection unit, ions having masses different from the predetermined mass are deflected away from the second optical axis 144 as indicated by ion beams 171 and 173. Thereby, ion beams 171 and ion beams 173 illustrate ion beams consisting of ions having a mass smaller than the predetermined mass or higher than that predetermined mass, respectively. The selected ion beam 172, which includes ions having a predetermined mass or a predetermined range of masses, passes through the mass separation aperture 154 and is focused by objective lens 124 on specimen 130. The ion beam 172 can be utilized for a plurality of applications.

According to one embodiment, the ion source 110 is a liquid metal alloy ion source (LMAIS). Therein, for example a metal alloy is provided on a tungsten hairpin or another wire, which can be heated. According to one embodiment the metal alloy can be the binary alloy, such as SiPr, SiAu, or AuSiMn or a combination of silicon and another metal. Typically, the metal is a heavy metal with a mass of 100 g/mol the or higher. As another example, Mn may be combined with a heavy metal or with another metal, e.g., as AuSiMn, or GaMn. A further example can be CoNd.

According to another embodiment, the metal alloy is eutectic. Thereby, the melting temperature of the alloy is reduced as compared to the melting point of the individual elements.

According to one embodiment, an emitter for an ion source is provided, wherein said emitter includes the binary alloy PrSi as a source material. Thus, only Pr and Si ions as well as a small amount of cluster and molecular ions are generated by the ion source according to this aspect of the present invention. Accordingly, no impurities will be introduced into semiconductor materials when being processed with an ion beam generated by this ion source. Furthermore, Pr ions are much heavier than Si ions. Accordingly, when structuring semiconductor surfaces Pr can be used for quick surface degradation whereas the lighter Si ions can be used for fine degradation or inspection. Thus, the binary alloy PrSi allows for fast and fine surface degradation as well as inspection with a single ion source. Finally, in contrast to pure Pr binary alloy PrSi is sufficiently stable when exposed to air so that the PrSi ion source can be readily manufactured and mounted.

Generally, if a liquid metal alloy ion source is used according to embodiments herein, ions with a high mass can be emitted for higher milling rates as compared to, for example, gallium sources. Further, ions with significantly different masses can be generated. Thereby, it is possible to provide different modes of operation. According to some embodiments, the difference in mass of the generated ions is, for example, at least 5 g/mol, 10 g/mol, 50 g/mol, 100 g/mol or higher. For one operational mode, a heavy ion species can be selected and for another operational mode a light ion species can be selected.

However, according to further embodiments, it is also possible to use a liquid metal ion source LMIS made of Ga, Bi, In, Sn, Sb or the like. Thereby, it might be possible to adapt the achromatic deflection unit 162 and the mass separation aperture 154 to select different isotopes from the emitted ions.

In a LMIS, a tiny hairpin and a filament, typically made of W, Ta, Ti or Ni, are used as an emitter. Also, reservoir type emitters with and without hairpin and porous emitters are known.

If a liquid metal alloy ion source is applied, the increased mass of the ions and the higher probability of having ions which are twice charged provide higher energies and thus higher sputtering rates. Generally, if different ion species are emitted by an ion beam source, a selection of the species may be conducted as follows. With the achromatic deflection unit it is possible to achromatically select ion species with respect to q/m. That is, it is possible for most applications to select ion species according to their mass and/or according to their charge.

For the embodiments described herein, it is typical that electrostatic lenses can be used for collimating, shaping or focusing of the ion beam. The electrostatic lenses can be applied as Einzel lenses, as accelerating lenses, or decelerating lenses. Alternatively or additionally, it may be possible to provide some magnetic focusing elements. However, high magnetic fields may be required.

Next, further embodiments regarding the achromatic deflection unit 162 and the mass separation aperture 154 will be described. These details can be combined with any of the embodiments described herein. State of the art ion beam devices mostly use Wien or ExB velocity filters to separate ions with different mass and charge. Thereby, substantially perpendicular static electric and magnetic fields normal to the z-axis (optical axis) are used. The force acting on the ions is given by the coulomb force $$F_e = q \cdot E \quad (1)$$

and the Lorentz force $$F_m = q \cdot (v \times B) \quad (2).$$

The angle of deflection of the ions in the electric and magnetic fields, both of length l, can be described with the following equation:

$$\theta = ql(vB - E)/(mv^2) \quad (3).$$

Figure 1B:
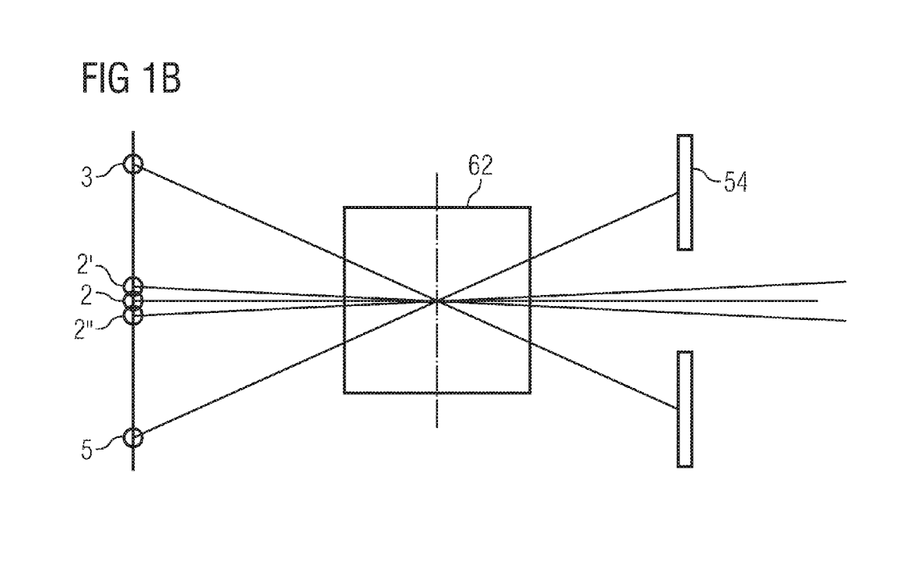
FIG. 1B shows a schematic view of a Wien filter for mass separation for an ion beam and virtual beam paths corresponding to different masses and velocities.

Within FIG. 1B, a Wien filter 62 and a blocking aperture 54 is shown. The beam paths shown in FIG. 1B illustrate virtual sources 2, 2', 2", 3, and 5 as seen from behind the Wien filter 62 if ions originating from source numeral 2 have different masses and velocities. As can be seen by equation 3, the deflection angle depends from the charge of the species within the filter, the length l of the filter, the mass of the species and the velocity of the species. As a result, for example ions with different masses seem to originate from a different virtual source. This is illustrated in FIG. 1B by virtual sources 3 and 5. Such a selection is desired for a mass separator. However, the influences of different velocities or energies also blur the virtual source of the ions with the desired mass. Within FIG. 1B this is indicated by sources 2, 2', and 2". For ion sources according to the embodiments described above, the variation in velocity or energy, respectively, can be between 5 to 15 eV or even higher. Thus, the blurring of the desired ion species may significantly influence the ion beam quality.

Figure 1C:
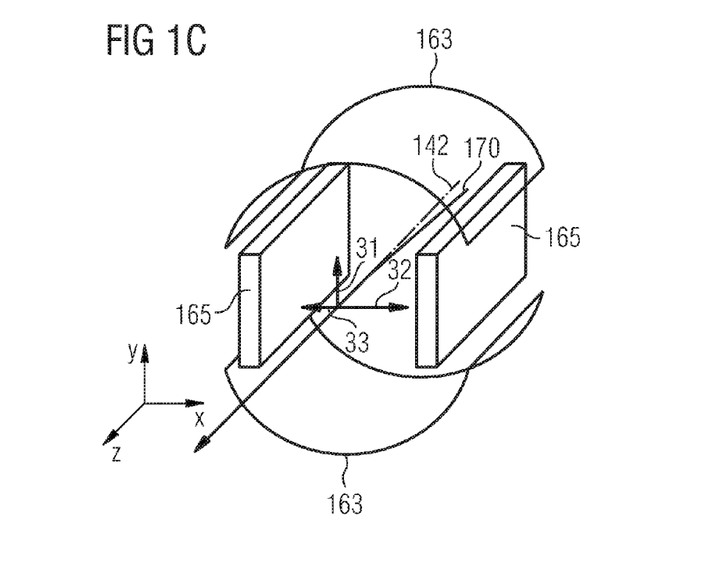
FIG. 1C shows a schematic view of an achromatic deflection system for mass separation according to embodiments described herein.

FIG. 1C illustrates one embodiment of an achromatic mass separator. Therein, coil windings 163 and plate-shaped electrodes 165 are shown. The coils 163 generate a magnetic field 31. The magnetic field generates a magnetic force 32 for an ion beam 170. The magnetic force is generated according to equation 2. Substantially perpendicular to the magnetic field 31 an electric field is generated between the electrodes 165. Thereby, an electric force 33, which is substantially opposite to the magnetic force, is generated.

The embodiment shown in FIG. 1C generates perpendicular, uniform magnetic and electric fields. According to other embodiments, for example, a quadruple arrangement of can be utilized. This is for example shown in FIG. 2 of U.S. Pat. No. 4,590,379, wherein a quadruple lens in combination with an achromatic bending is described. Alternatively, four current carrying electrodes, which extend essentially along the optical axis of the deflector used to generate the magnetic and electric fields, respectively, are described.

Within FIG. 1C, the ion beam path 170 is slightly inclined with respect to the axis 142 when the ions enter the achromatic deflector. The ions are deflected within the achromatic deflector to travel essentially along axis 144 after trespassing the achromatic deflector. This can be understood in light of the derivative of equation 3, that is $$d\theta/dv = -(ql/mv^2)(1 - 2E/vB) \quad (4)$$

The deflection angle is independent of the velocity of the ions if the condition that the magnetic force equals twice the electric force is fulfilled. In FIG. 1C this is illustrated by the lengths of the force indicating arrows 32 and 33.

In embodiments described herein, the achromatic deflector 162 (see FIG. 1) can be described at least by one of the following features. According to one embodiment, the achromatic deflection unit has an inductance of 0.05 µH to 2 µH, or, e.g., 0.1 to 2.0 µH.

For a deflection a relatively high magnetic induction may be applied in order to deflect heavy ions of, e.g., a LMAIS. As a result, the magnetic field can be 0.02 T to 0.5 T. A corresponding electric field can be 4 V/mm to 75V/mm.

The magnetic flux density of 0.02 T to 0.5 T can be generated by an electromagnet, a permanent magnet, a combination of a permanent magnet and electromagnet or some other magnetic device.

In light of the above, according to a further embodiment, which may be combined with the other embodiments described herein, 75 to 500 ampere turns or even a few thousand ampere turns may be provided. According to an even further embodiment, about 10 to 400 coil windings can be provided. Yet according to another embodiment, 50 to 500 coil windings can be provided. Nevertheless, it might be possible to provide even more coil windings, for example, up to a few thousand.

According to further embodiments of achromatic deflection units adapted for the mass separation, the material of the pole pieces may include a magnetically soft material. This can, for example, be a µ-metal.

According to an even further embodiment, the achromatic deflection angle can be between 0.3° and 7°. According to another further embodiment, the deflection angle is between 1° and 3°. The achromatic deflection angle is illustrated as angle 164 in FIG. 1.

Figure 2A:
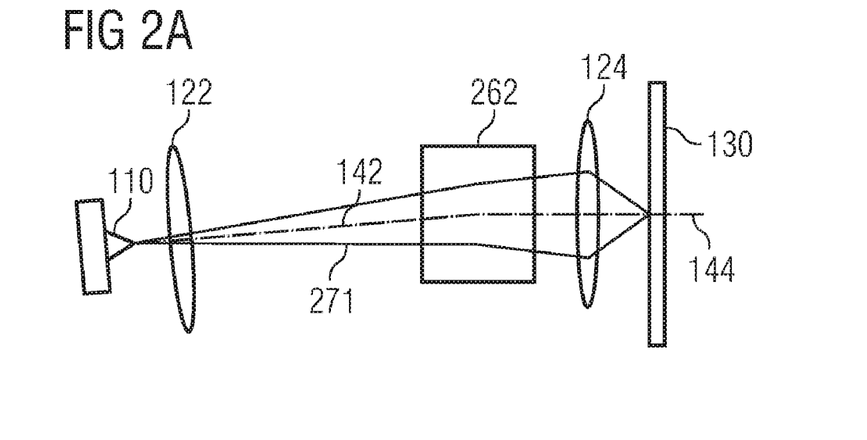
FIGS. 2A to 2C show schematic views of an ion beam device according to embodiments described herein, wherein different beam path are realized to illustrate the flexibility of the system.
Figure 2B:
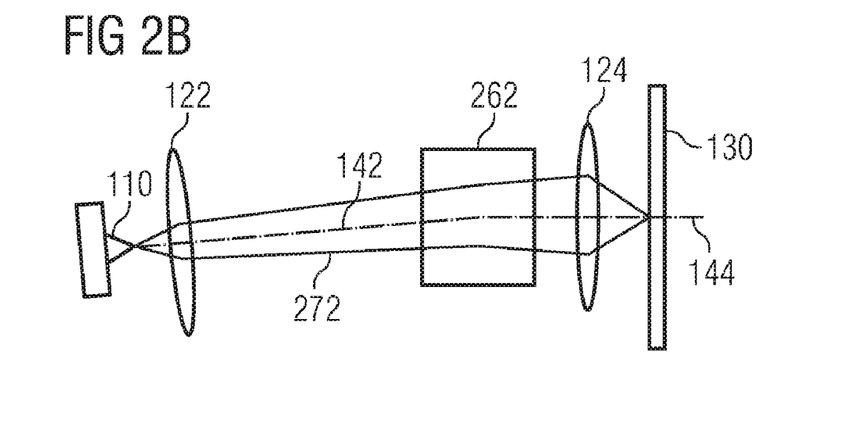
Figure 2C:
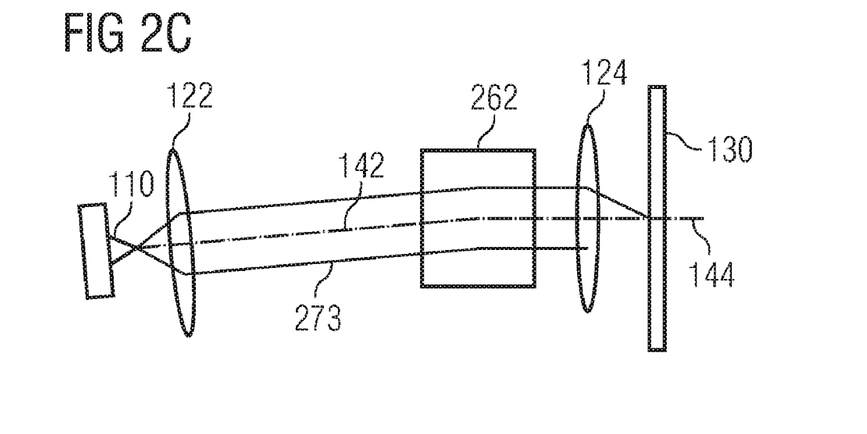

Generally, the ion beam devices according to embodiments described herein provide an achromatic mass separation unit and maintain a high flexibility of operating of the device. For better understanding, three different beam paths are illustrated in FIG. 2A to FIG. 2C. FIGS. 2A to 2C include an ion beam source 110, a condenser lens 122, a mass separator 262, and an objective lens 124. The mass separator 262 includes an achromatic deflection unit and a mass separation aperture, both components are, for simplicity, not explicitly shown in FIGS. 2A to 2C.

The ion beam first travels along axis 142. Within the achromatic deflector of the mass separator it is deflected towards axis 144 and is finally focused on the specimen 130 by objective lens 124. FIG. 2A shows a situation wherein the condenser lens 122 is switched off or has a small excitation. Therefore, the beam path 271 results in a small probe current, a small spot size, and a high-resolution. Within FIG. 2B, the condenser lens 122 has a medium excitation. The excitation may, for example, be in the range of 10 to 14 kV. When compared to FIG. 2A, the probe current increases. This results in a faster milling or sputtering rate and a reduced resolution. The beam path 273 of FIG. 2C shows a situation with a strong excitation, for example, in the range of 28 to 22 kV. Thereby, large probe currents, a large spot size, even higher milling or sputtering rates and a low resolution is realized.

In light of the above, the ion beam device according to the embodiments described herein enables a system, which is capable of providing different beam currents and milling/sputtering rates and also varying resolutions. This system is further capable of imaging the source on the specimen even in the case when only one ExB mass separation unit in the form of an achromatic deflection unit is included in the system. Further, the system is easy to calibrate with respect to different operational applications and easy to align.

According to further embodiments, ion beam devices including a crossover can be provided.

Within the embodiments described herein, after the first alignment, the condenser lens can be set to any excitation without the necessity to re-adjust the achromatic deflection unit. Therefore, condenser lens settings can be optimized for a desired application with out time consuming alignment or re-alignment of the mass separator.

Figure 3:
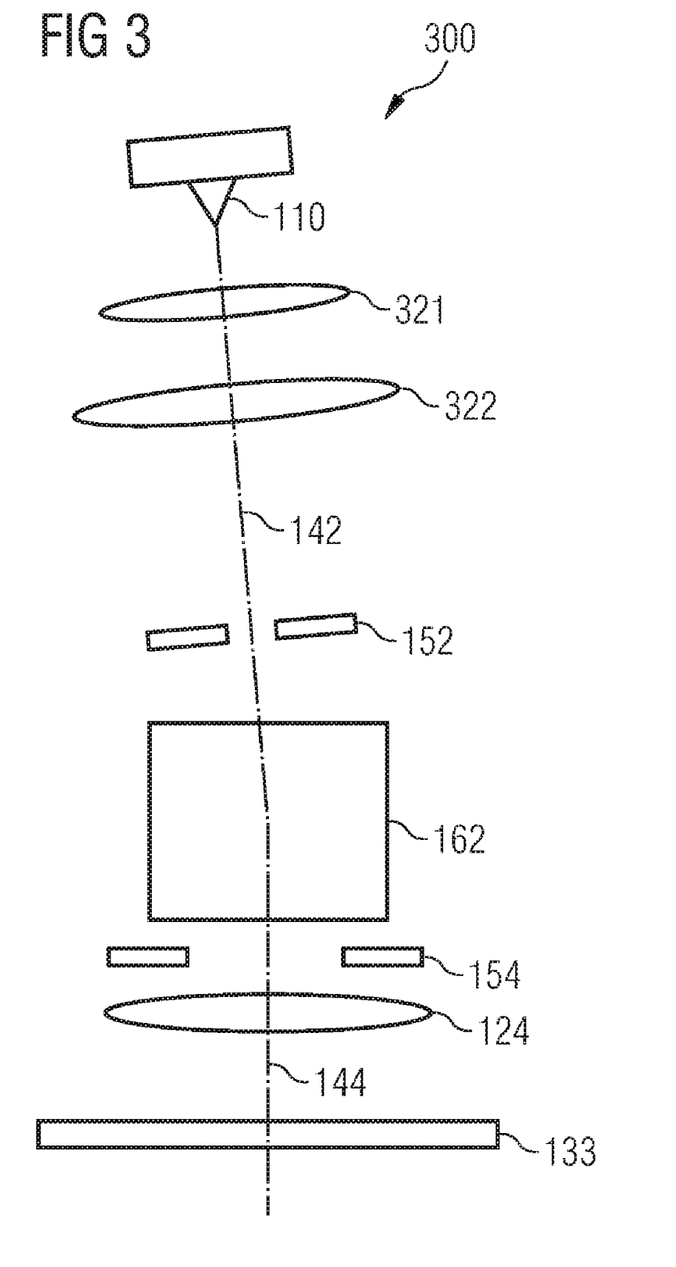
FIG. 3 shows a schematic view of an ion beam device including a mass separation for the ion beam according to further embodiments described herein.

Within FIG. 3 another ion beam device 300 is illustrated. According to one embodiment, the ion beam device includes an ion beam source 110, which emits an ion beam along a first axis 142. An aperture 152 is provided for shaping the beam and/or providing the numerical aperture of the system. The ion beam 170, which originates from the ion beam source 110, is shown to enter the achromatic deflection unit 162. Within the achromatic deflection unit, ions having masses different from the predetermined or nominal mass are deflected away from the optical axis 144. The nominal mass, i.e., the selected ion beam 172, which includes ions having a predetermined mass or a predetermined range of masses, passes through the mass separation aperture 154 and is focused by objective lens 124 on specimen 130. The ion beam 172 can be utilized for a plurality of applications.

According to one embodiment, the ion source 110 can be a liquid metal alloy ion source (LMAIS). Therein, for example a metal alloy is provided on a tungsten hairpin or another wire which can be heated. According to one embodiment the metal alloy can be the binary alloy, such as SiPr, SiAu, or it can be AuSiMn or a combination of silicon and another metal. Typically, the metal is a heavy metal with a mass of 100 g/mol the or higher. In another example, Mn may be combined with a heavy metal are with another metal, e.g., GaMn. According to another embodiment, the metal alloy is eutectic. Thereby, the melting temperature of the alloy is reduced as compared to the melting point of the individual elements. According to another embodiment, the difference in mass of the generated ions is, for example, at least 5 g/mol, 10 g/mol, 50 g/mol, 100 g/mol or higher. For one operational mode, a heavy ion species can be selected and for another operational mode a light ion species can be selected. According to some embodiments, one ion species can also be selected for more than one operational mode, e.g., sputtering/milling and inspection. If a liquid metal alloy ion source is applied, the increased mass off the ions and the higher probability of having ions which are twice charged provide higher energies and thus higher sputtering rates.

As shown in FIG. 3, the ion beam device additionally includes a collector lens 321. Further, there is a condenser lens 322 and an objective lens 124. An electron beam device including a collector lens 321 and condenser lens 322 can enable an adjustment of the numerical aperture for a plurality of fixed aperture diaphragm diameters of the beam paths within the system. Thus, an improved resolution can be provided over a larger range of beam current values.

As exemplarily described with respect to FIG. 1C, the ExB deflection unit has, according to one embodiment, superimposed electric and magnetic dipole fields. Thereby, according to an even further embodiment the respective dipole strength E(z) and B(z) have the same shape. The same shape of E(z) and B(z) enables the adaptation of the achromatic deflection unit to satisfy equation 4 along the entire ion beam trajectory.

According to further embodiments, the electric and magnetic dipole fields and/or the components generating the electric and magnetic dipole fields may be separated from each other, that is, they do not overlap along the direction of the optical axis. Thereby, a corresponding system can typically be arranged with short deflection regions along the optical axis.

For the embodiments including separate electric and magnetic dipoles the tilted ion beam crosses the optical axis at the pivot point of the achromatic deflection unit which is a combined deflector.

Figure 4A:
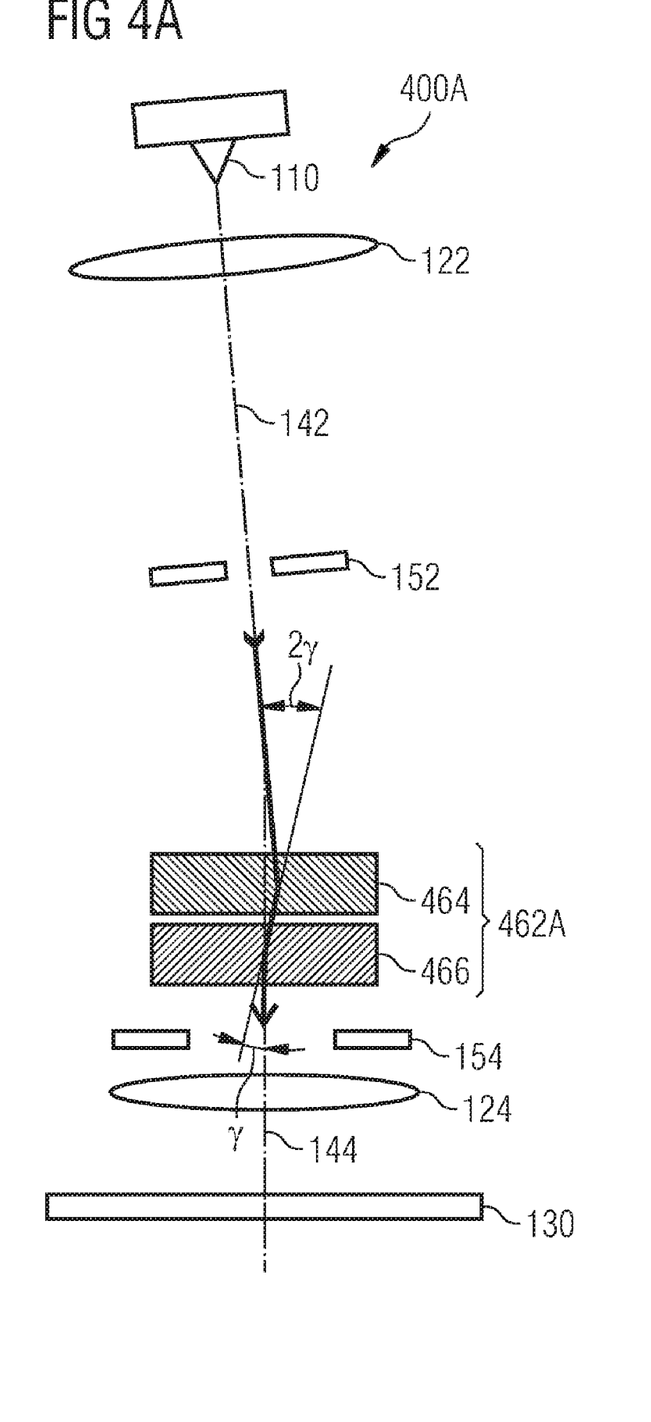
FIG. 4A shows a schematic view of an ion beam device including a combined mass separation deflection unit for an ion beam according to further embodiments described herein.

FIG. 4 illustrates an electron beam device 400. Therein, and magnetic deflector 464 and an electrostatic deflector 466 are included in the achromatic deflection unit 462.

The magnetic deflector 464 deflects the ion beam by an angle of 2γ. Substantially on the axis 144, the electrostatic deflector 466 deflects the ion beam towards the axis 144 by an angle γ. Thereby, a combined deflection angle is realized with the combined achromatic deflection unit 462.

Figure 4B:
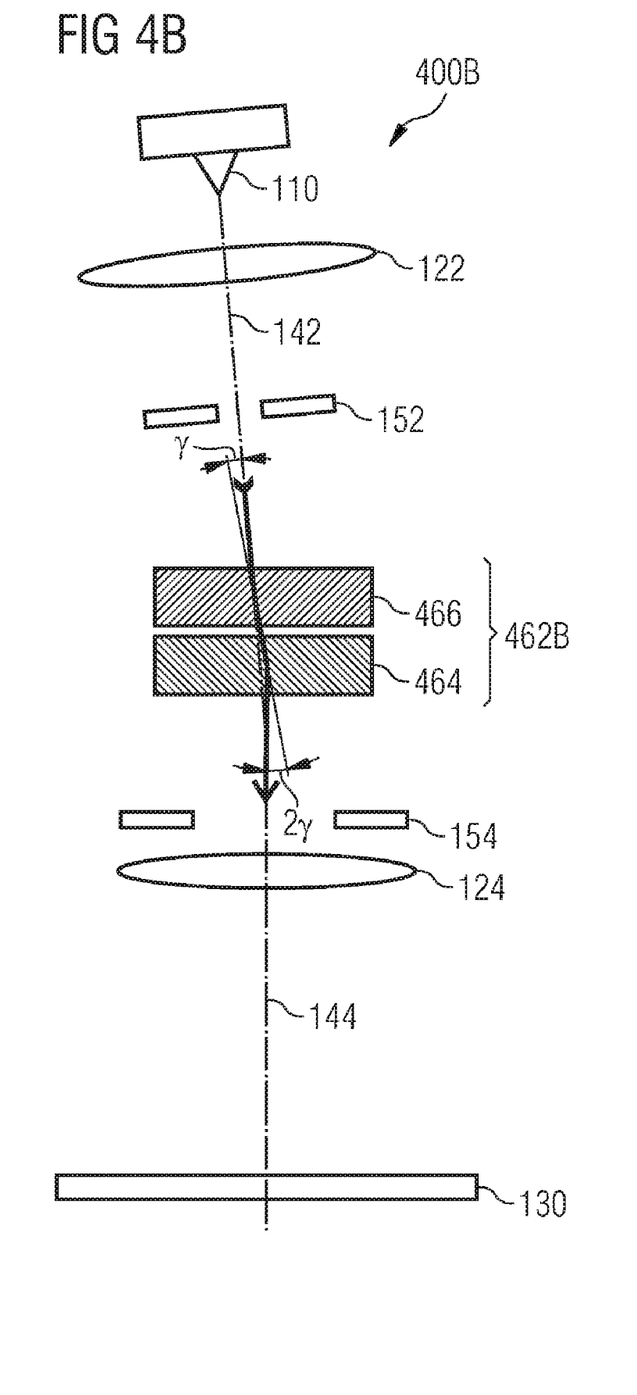
FIG. 4B shows a schematic view of an ion beam device including another combined mass separation deflection unit for an ion beam according to further embodiments described herein.

Within FIG. 4B, a further ion beam device 400 is illustrated. Therein, the electrostatic deflector 466 is provided above the magnetic deflector 464. Thereby, a combined achromatic deflection unit 462 is provided. Similarly to FIG. 4 and in accordance with the condition that the magnetic force equals twice the electric force, the electrostatic deflector 462 deflects the beam by an angle γ. Thereafter the magnetic deflector 464 deflects the ion beam by an angle 2γ and re-deflects the ion beam along axis 144.

Generally, within the embodiments described herein the optical axis of the system is referred to as the axis 144 since axis 144 substantially coincides with the axis of the objective lens 124. However, it should be noted that the initial "optical" axis, i.e., axis 142, of the ion beam devices according to the embodiments described herein is inclined with respect to the optical axis 144.

According to the embodiments described with respect to FIG. 1 and FIGS. 4A and 4B, the magnetic and electric dipole fields overlap substantially or do not overlap. Thereby it is to be understood that the non-overlapping fields are provided if the elements generating the different fields do not overlap along the axis along the direction of the axis. For this understanding used herein, cross-talk of neighboring fields is neglected.

According to further embodiments, the magnetic and electric fields can partly overlap. According to even further embodiments, dipole, quadrupole, octupole, or even high or order fields can be applied. Further embodiments will be described with respect to FIGS. 5A and 5B. Within FIG. 5A components for generating an electric and magnetic field are fixed to a housing 566. Thereby, the housing can be, e.g., a common frame. The magnetic dipole field is generated by coils 569 with windings around core 564. The pole piece 568 is adjacent to the core and the magnetic field is generated between the two pole pieces. Further, electrodes 567 are mounted to frames 565. Within the gap between the pole pieces and the gap between the electrodes substantially perpendicular fields are generated. According to one embodiment, the gap between the pole pieces can be between 2 and 10 mm, and the gap between the electrodes can be between 1 and 8 mm.

Figure 5A:
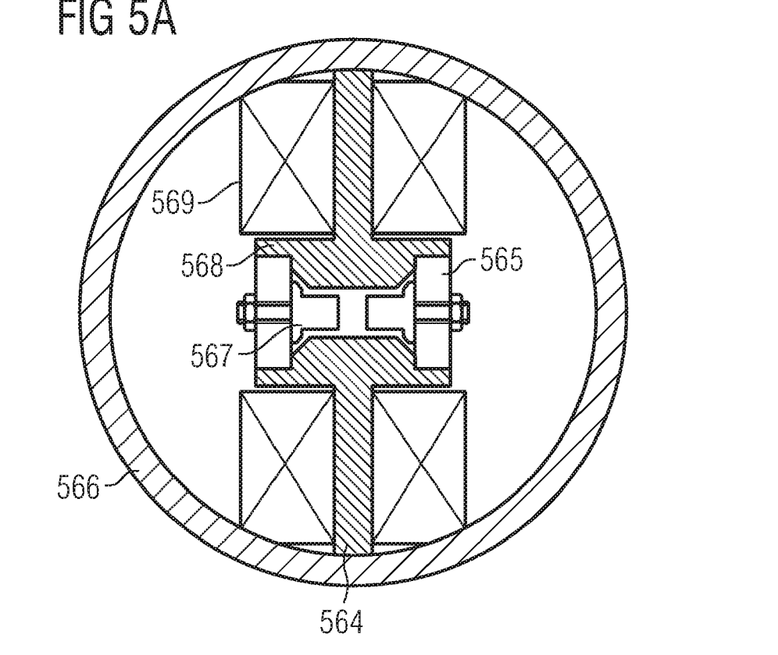
FIG. 5A shows a schematic view of an achromatic deflection system for mass separation according to embodiments described herein, wherein dipoles are employed.

According to a further embodiment, the pole pieces, the core and the housing 566 can consist of a μ-metal.

According to an even further embodiment, the coils are provided within a capsulating housing for providing atmospheric pressure and thereby an improved cooling.

According to even further embodiments, the lengths of the entire system, which is defined by the housing 566, may be between 40 mm and 120 mm. Nevertheless the length can also be 150 or 200 mm. Generally, a shorter length of the deflection region results in a smaller distance of the incoming ion beam with respect to the axis of the deflection unit. Thereby, aberrations generated by an off-axis ion beam can be reduced. According to an even further embodiment, the length of the pole pieces and the electrodes along the axis of the ion beam trajectory can be in the range of 30 mm to 100 mm. As described with regard to the lengths of the housing of the deflection unit, longer field generating elements, e.g., 140 a 190 mm can be used. However, this may result in increased aberrations.

According to some embodiments of achromatic deflection units having overlapping magnetic and electric fields, the fields can be similarly shaped along the optical axis of the deflection unit. Thereby, commonly used field shaping techniques, like chamfering the shape of the electrodes at the leading and trailing edges (in z-direction), or concave electrode shapes can be used.

Further, the achromatic deflection units disclosed herein generate a nominal deflection for the ions having a nominal energy. As a result, if an arrangement of straight electrodes and pole pieces or straight magnetic and electric fields, respectively, is considered, the ion beam enters the deflection unit off axis. As a result, systems may have a reduced deflection quality if higher multi-pole components are not sufficiently small.

Figure 5B:
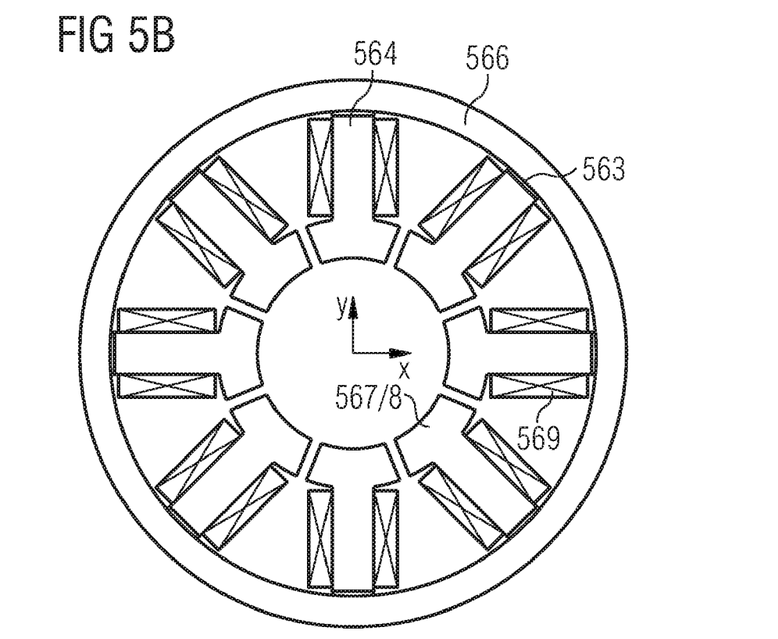
FIG. 5B shows a schematic view of an achromatic deflection system for mass separation according to embodiments described herein, wherein octupoles are employed.

According to some embodiments described herein, systems including substantially pure dipole fields can be used. FIG. 5B shows system having eight electrodes and pole pieces. Cores 564 are connected to the housing 566 via insulators 563. The coils for exciting the cores and, thereby, the pole pieces are wound around the cores 564. At the other end of the cores, electrode-pole pieces 567/8 are provided. According to embodiments employing a deflection unit as, for example, shown in FIG. 5B, the fringing fields can be provided to be similar for the magnetic field and the electric field; and highly pure dipole fields can be generated. However, the system including eight coils and eight electrodes require more current- and voltage-sources, thereby, costs are increased. As a result, optimized systems having two poles each (electric and magnetic), might typically be used for the embodiments described herein.

The achromatic deflection units described herein (see, for example, the portion of the specification referring to FIG. 1C, FIG. 5A, and FIG. 5B), which may be used for the ion beam devices according to the embodiments described herein, can be adapted for the mass separation of ion beams. According to one embodiment, this includes an adaptation of deflecting species having a relatively high mass. Further, an adaptation for a non-dynamic deflection, i.e., adjustable static deflection can be provided. The non-dynamic deflection is static with respect to one mode of operation and can be switched from one static deflection mode to another static deflection mode.

In light of the high mass of, for example Si, Pr or other metals that can be used in liquid metal ion sources and particularly, in liquid metal alloy ion sources, an acceleration voltage results in a relatively low velocity. For a deflection a relatively high magnetic induction may thus be applied. According to one embodiment, the deflection angle for the achromatic deflection unit is between 0.3° and 7°. According to another embodiment, the deflection angle is between 1° and 3°. Yet according to further embodiments, the magnetic field can be 0.2 T to 0.5 T. A corresponding electric field can be 4 V/mm to 75V/mm.

In light of the above, according to a further embodiment, which may be combined with the other embodiments described herein, 75 to 500 ampere turns may be provided. According to an even further embodiment, about 10 to 400 coil windings can be provided. Yet according to another embodiment, 50 to 500 coil windings can be provided. Nevertheless, it might be possible to provide even more coil windings, for example, up to a few thousand.

According to further embodiments of achromatic deflection units adapted for the mass separation, the material of the pole pieces may include a magnetically soft material. This can, for example, be a µ-metal.

Referring back to FIGS. 1 and 3 and referring to the other ion beam devices including the mass separation disclosed herein, a mass separation aperture, for example an aperture diaphragm, is provided. According to one embodiment, the opening of the aperture has a shape and positioned such that the mass separating aperture does not define the numerical aperture of the system. According to a further embodiment, the aperture opening can have a diameter of 0.6 to 3 mm, e.g., 1 mm to 2 mm. This can for example be provided for beam diameters of 0.2 to 0.9 mm. According to an even further embodiment, the mass selection aperture is provided between the achromatic deflection unit and the objective lens. Typically it may be closer to the objective lens, for example, with in 100 mm of the objective lens.

Figure 6:
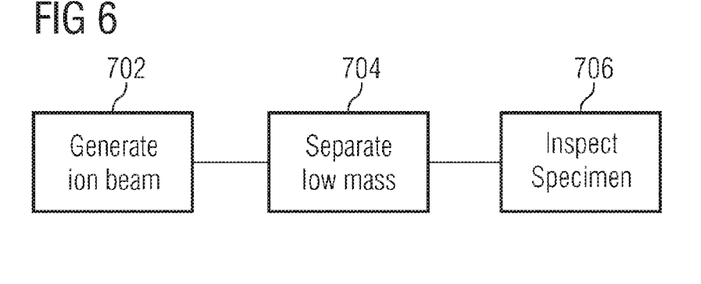
FIG. 6 shows a flow chart illustrating a first operational mode according to embodiments described herein for an ion beam device including a mass separation assembly.

Next, applications for the ion beam devices described herein will be described with respect to FIGS. 6 to 8. Thereby, reference is made to a liquid metal alloy ion source including Si and Pr. However, it is to be understood that the applications are not limited to these elements. Generally, the applications can typically be used for a liquid metal ion sources or a liquid metal alloy ion sources. Thereby according to some embodiments, sources emitting ions having different masses, for example, at least 30 g/mol difference, can be provided.

Further to the different probe current described above, an ion beam device emitting Si and Pr can be used as follows. On the one hand, Pr, which has a higher mass as compared to Si, can be deflected such that the Pr ions trespass the mass separation aperture and are focused on the specimen. Thereby, the Pr ions are selected and the Si ions are blocked. The higher mass of the Pr ions result in a faster milling or sputtering rage. Thereby, for example a cascade of collisions within the specimen can result in an amorphous material. On the other hand, the achromatic deflection unit can be adjusted such that the Si ions trespass the mass separation aperture and Si can used for inspection purposes.

Methods of applying the different operational modes are described next. Within FIG. 6, first the ion beam is generated in step 702. According to one embodiment, the ion beam can be generated by heating a eutectic alloy. Within step 704 the lower mass ions are separated from the higher mass ions.

Thereby, a beam shaping aperture is provided, the ion beam is achromatically deflected such that ions having the low mass can trespass the opening of the mass separation aperture. Generally, within the embodiments described herein, an achromatic deflection refers to the fact that the ions having the same mass but a different velocity (in the range of ΔE±120 eV) are deflected by substantially the same deflection angle.

Contrary to ions having the nominal mass, which is to be selected, ions having a mass different therefrom are blocked by the mass separation aperture. According to a different embodiment, isotopes of one element can trespass the mass separation aperture and other elements are blocked. Typically, separated masses vary by at least 10 g/mol and/or between 50 g/mol or 150 g/mol. The specimen is inspected with the low mass-ion beam within step 706. For inspection the ion beam is raster scanned over the specimen and resulting secondary and/or backscattered particles are detected with a detector.

Figure 7:
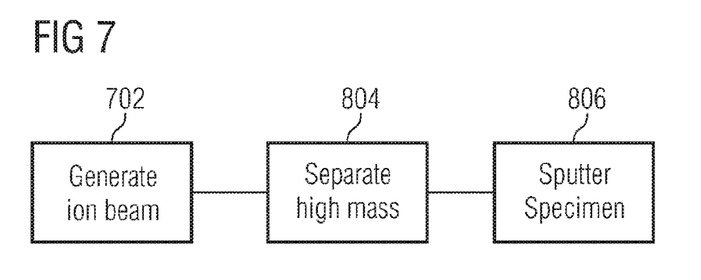
FIG. 7 shows a flow chart illustrating a second operational mode according to embodiments described herein for an ion beam device including a mass separation assembly.

Within FIG. 7, an ion beam is generated in step 702. Within step 804, the ion beam is deflected such that the high mass ions are deflected to trespass the mass separation aperture where as low mass-ions are blocked by the mass separation aperture. The high mass-ion beam can be scanned and focused on a specimen for milling or sputtering applications.

Figure 8:
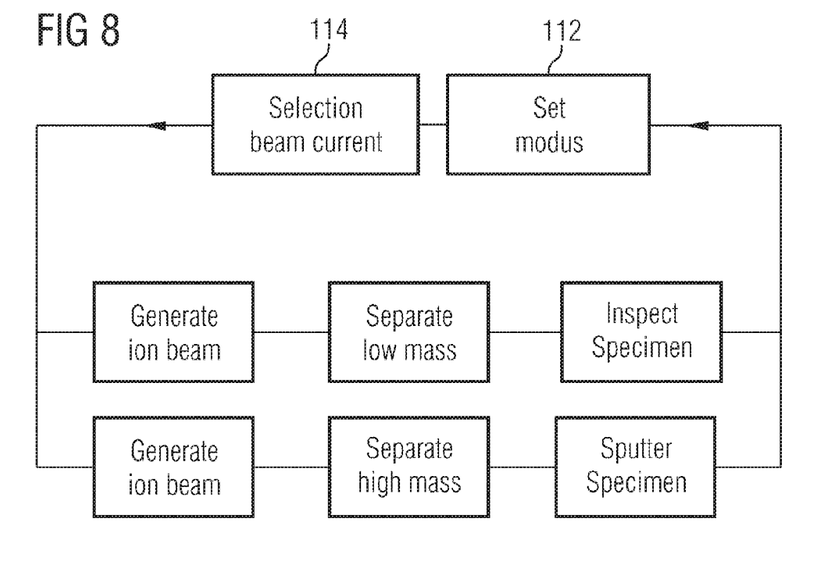
FIG. 8 shows a flow chart illustrating a method for combining different operational modes according to embodiments described herein for an ion beam device including a mass separation assembly.

FIG. 8 illustrates an embodiment wherein the different modes of operation are combined. The method starts at step 112. Therein, the mode for the next application is defined. Within step 114 an ion beam current is selected as described with respect to FIG. 2. According to the modes chosen in step 112 the method next conducts any of the methods described with respect to FIGS. 6 and 7. This method can be employed a plurality of times until within step 112 or step 114 the application mode is changed or the ion beam current is adapted.

Within the present application embodiments of ion beam devices are provided. The ion beam device can include an ion beam source for generating an ion beam including a first ion species with a first mass and a second ion species with a second mass. The ion beam is emitted along a first axis. The system can include a condenser lens, an aperture unit adapted to shape the ion beam, and an achromatic deflection unit adapted to deflect ions of the ion beam. The achromatic deflection unit includes an electric field generating component for generating an electric field, and a magnetic field generating component for generating a magnetic field substantially perpendicular to the electric field. The ion beam device further includes a mass separation aperture adapted for blocking ions with the second mass (first mass) different from the first mass (second mass) and for allowing ions having the first mass (second mass) to trespass the mass separator. The device also includes an objective lens having a second optical axis, wherein the second optical axis is inclined with regard to the first axis.

According thereto, a mass separation unit is provided in the ion beam device. The mass separation unit is a non-straight vision system. The non-straight vision system can be combined with a flexibly beam path. The flexibility of the beam path can be maintained due to the fact that—for a linear approximation—different velocities of ions having a similar mass do not blur the image of the source.

According to one particular embodiment of the ion beam device, the ion beam source can be a liquid metal alloy ion source. Thereby, the liquid metal alloy ion source can include a binary alloy of silicon and a material with a mass of above 100 g/mol. As an example, the binary alloy can be PrSi. Other examples are possible. Typically, the alloys can be, e.g., eutectic.

According to further embodiments it may additionally be possible that the aperture unit for shaping the beam is provided above the beam deflection. Thereby, the above is to be understood in light of an ion beam device having a beam direction from the top to the bottom of the system.

According to even further embodiments, the deflection angle of the deflection unit is at least 0.5° such that the entire ion beam device is a non-straight vision system. Thereby, it is possible that the achromatic deflection unit consists of: one electric field generating component for generating an electric field and one magnetic field generating component for generating a magnetic field substantially perpendicular to the electric field.

Yet according to even further embodiments, which can be independently or additionally realized to any of the above-mentioned embodiments, the ion beam device is adapted for providing an adjustable static deflection. Thereby, for different modes of operation and/or different selection of ion species the excitation can be varied. However, the excitation is static in the sense that the deflection is not used for scanning or the like. According thereto, the electric field generating component and the magnetic field generating component can be connected to adjustable DC power sources. Further, alternatively or additionally, the magnetic field generating component has an inductance of 0.1 to 2 µH and/or between 50 and a few thousand ampere turns. This can, for example be realized with a magnetic field generating component which includes coils having at least 30, preferably at least 50 windings.

Yet according to even further embodiments, which can be independently or additionally realized to any of the above-mentioned embodiments, the mass separation aperture can have a diameter larger than a beam diameter of an ion beam. With this ion beam consisting of the ions of the group consisting of: ions with the predetermined mass. Typically, this may for example be a diameter larger than a beam diameter of an ion beam consisting of the ions of the group consisting of: ions with the predetermined mass and ions with a mass in the range of the predetermined mass +−5 g/mol and/or a diameter of about 0.5 mm to 3 mm.

According to further embodiments, methods of operating an ion beam device are provided. The methods include: emitting an ion beam, wherein the ion beam includes two ion species having a first mass and a second mass different from the first mass. The method further includes deflecting the ions having the first mass by a deflection angle of at least 0.5°, blocking the ions having the second (first) mass, and focusing the ion beam of the ions having the first (second) mass on a specimen. According to further embodiments, the masses may differ by at least 10 g/mol.

According to different modes of operation, the ion beam of the ions having the first mass can modify the specimen. Alternatively, an ion beam of one of the ions can be used to inspect the specimen or can be used to modify the specimen. Thereby, it is additionally or alternatively possible to vary the ion beam current for different applications. Typically, the ion beam current can be varied for different applications without varying the deflection angle.

While the foregoing is directed to embodiments of the invention, other and further embodiments of the invention may be devised without departing from the basic scope thereof, and the scope thereof is determined by the claims that follow.

The invention claimed is:

1. Ion beam device, comprising:
   an ion beam source for generating an ion beam, the ion beam being emitted along a first axis;
   an aperture unit adapted to shape the ion beam;
   an achromatic deflection unit adapted to achromatically deflect ions of the ion beam having a predetermined mass by a deflecting angle such that ions having the same mass but different velocities are deflected by substantially the same deflection angle, the achromatic deflection unit comprising:
      an electric field generating component for generating an electric field; and
      a magnetic field generating component for generating a magnetic field substantially perpendicular to the electric field, wherein the electric field generating component and the magnetic field generating component are connected to adjustable DC power sources;
   a mass separation aperture adapted for blocking ions with a mass different from the predetermined mass and for allowing ions having the predetermined mass to trespass the mass separation aperture; and
   an objective lens having a second optical axis, wherein the second optical axis is inclined with regard to the first axis and the achromatic deflection unit is adapted to deflect the ion beam from the first optical axis to the second optical axis.

2. Ion beam device according to claim 1, wherein the ion beam source is a liquid metal alloy ion source.

3. Ion beam device according to claim 2, wherein the liquid metal alloy ion source is a binary alloy comprising:
   silicon; and
   a material with a mass above 100 g/mol.

4. Ion beam device according to claim 3, wherein the binary alloy is PrSi.

5. Ion beam device according to claim 2, wherein the liquid metal alloy ion source is eutectic.

6. Ion beam device according to claim 1, wherein the first axis and the second optical axis are inclined by at least 0.5°.

7. Ion beam device according to claim 1, wherein the length of the electric field generating component and the magnetic field generating component along the first axis is in the range of 30 mm to 100 mm.

8. Ion beam device according to claim 1, wherein the magnetic field generating component has an inductance of 0.1 to 2 μH.

9. Ion beam device according to claim 1, wherein the magnetic field generating component has between 50 and 250 ampere turns.

10. Ion beam device according to claim 1, wherein the magnetic field generating component comprises coils having at least 30 windings.

11. Ion beam device according to claim 1, wherein the electric field generating component is adapted to generate the electric field with 4 V/mm to 75 V/mm.

12. Ion beam device according to claim 1, wherein the mass separation aperture has a diameter larger than a beam diameter of the ion beam comprising the ions having the predetermined mass.

13. Ion beam device according to claim 1, wherein the mass separation aperture has a diameter larger than a beam diameter of the ion beam comprising the ions having the predetermined mass and ions with a mass in the range of the predetermined mass ±5g/mol.

14. Ion beam device according to claim 1, wherein the mass separation aperture has a diameter of about 0.5 mm to 3 mm.

15. Ion beam device according to claim 1, further comprising:
   a condenser lens.

16. Method of operating an ion beam device, comprising:
   emitting an ion beam along a first optical axis, the ion beam including a first ion species having a first mass and a second ion species having a second mass different from the first mass;
   achromatically deflecting the first ion species having the first mass by a deflection angle of at least 0.1° using an achromatic deflection unit comprising an electric field generating component and a magnetic field generating component connected to adjustable DC power sources, such that ions having the same mass but different velocities are deflected by substantially the same deflection angle, wherein the first ion species are deflected from the first optical axis to a second optical axis of an objective lens of the ion beam device at the achromatic deflection unit;
   blocking the second ion species having the second mass; and
   focusing the ion beam of the first ion species having the first mass on a specimen.

17. Method according to claim 16, wherein the second mass is lower than the first mass by at least 10 g/mol.

18. Method according to claim 16, wherein the ion beam of the first ion species having the first mass modifies the specimen.

19. Method according to claim 16, wherein the second mass is higher than the first mass by at least 10 g/mol.

20. Method according to claim 19, wherein the ion beam of the first ion species having the first mass is used to inspect the specimen.

21. The method according to claim 16, wherein the ion beam current is varied for different applications.

22. The method according to claim 16, wherein the ion beam current is varied for different applications without varying the deflection angle.

23. The method of claim 16, wherein the length of the electric field generating component and the magnetic field generating component is in the range of 30 mm to 100 mm.

* * * * *